(12) United States Patent
Chaudhari

(10) Patent No.: US 6,738,963 B2
(45) Date of Patent: May 18, 2004

(54) DYNAMICALLY RECONFIGURING CLOCK DOMAINS ON A CHIP

(75) Inventor: Sunil B. Chaudhari, Milpitas, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/184,545

(22) Filed: Jun. 28, 2002

(65) Prior Publication Data
US 2004/0003361 A1 Jan. 1, 2004

(51) Int. Cl.[7] ............................................. G06F 17/50
(52) U.S. Cl. ............................ 716/17; 714/729; 716/2; 716/6; 716/13
(58) Field of Search .................... 716/2, 6, 13, 17; 714/729

(56) References Cited

U.S. PATENT DOCUMENTS

| | | | |
|---|---|---|---|
| 5,452,239 A | * | 9/1995 | Dai et al. .................. 716/17 |
| 6,127,874 A | | 10/2000 | Wakabayashi et al. |
| 6,340,905 B1 | | 1/2002 | Schultz |
| 6,367,060 B1 | | 4/2002 | Cheung et al. |
| 2002/0040458 A1 | * | 4/2002 | Dervisoglu et al. ......... 714/729 |

* cited by examiner

Primary Examiner—Vuthe Siek
Assistant Examiner—Thuan Do
(74) Attorney, Agent, or Firm—Blakely, Sokoloff, Taylor & Zafman LLP

(57) ABSTRACT

Disclosed is an integrated circuit that includes clock generation circuitry which generates a master clock signal and at least one other clock signal. The master clock signal and the other clock signal are transmitted through a clock distribution tree to a circuit component. In a default mode, the circuit component receives the master clock signal at a first component block to create a first time domain for the first component block and receives the other clock signal at a second component block to create a second time domain for the second component block. Bypass logic creates a bypass path to allow the second component block to receive the master clock signal such that the clock domain of the second component block is the same as the clock domain of the first component block such that signals can be transferred between the clock domains with reduced latency.

14 Claims, 4 Drawing Sheets

DYNAMICALLY RECONFIGURING CLOCK DOMAINS ON A CHIP

BACKGROUND

1. Field

Embodiments of the invention relate to the field of clock architectures. More particularly, embodiments of the invention relate to dynamically reconfiguring clock domains on a chip.

2. Description of Related Art

Since the advent of the integrated circuit (IC), circuit components have become smaller and smaller. An IC may include millions of components packed into an incredibly small package. With each new generation of smaller integration, more functionality, and therefore more value, can be derived from ICs. Reliably manufacturing these highly integrated ICs, however, presents significant design challenges.

In particular, designing ICs that meet timing constraints can be particularly difficult. An IC may include tens of thousands of registers that need to be connected to one or more clock sources. For each clock "tick", or clock transition, thousands of registers have to operate in concert. A complex network is needed to propagate the clock signal to each of the registers. If the difference in propagation delay through two different paths in the network is too large or too small, errors may occur that can cause the entire IC to fail. Those skilled in the art will be familiar with numerous processes for synthesizing clock networks, or clock tree solutions.

Conventional integrated circuits (ICs) use a clock signal and branch it out through a series of buffers to form a plurality of clock signals. The structure of the branching of the clock signal is called a "clock tree." One or more clock trees can be present in a single IC. The clock signals at any level of the clock tree are sent to various synchronous components of the IC to coordinate the functions of these components. For various reasons, however, any two clock signals, even at the same level of the same clock tree, may be slightly different or offset from each other. This difference in clock signals is called "clock skew".

Clock skew has several causes. For example, the buffers between levels in the clock tree typically introduce a delay between their input and output clock signals, so clock signals at different levels of the clock tree are usually naturally skewed from each other. Additionally, the load experienced by one clock signal may introduce a delay into the clock signal different from that of another load on another clock signal. Furthermore, changes in temperature, different applied voltages and differing semiconductor fabrication processes can affect the clock skew.

Common IC fabrication techniques try to minimize clock skew by resizing buffers in the clock tree to move some of the clock signals forward or backward or by adding redundant loads to the circuits to balance the loading of the clock tree. Either technique alters the delay of some of the clock signals by a specified amount that is determined by analysis of the timing of the clock signals. With temperature changes, different applied voltages, differing silicon fabrication processes and/or inadequate tolerances in the silicon fabrication processes, the clock skew can even vary significantly from the nominal value. Due to this variation in clock skew, such ICs will often fail speed testing and not meet performance targets. As a result, IC fabrication yields will be low and costs will be high.

Further, as ICs continue to become more complex, having tens of thousand of registers which may be clocked by several different source clocks, at several different clock frequencies, through gated clocks, inverted clocks, etc., the processing time and expense required to meet continually more stringent design constraints using known approaches is becoming increasingly prohibitive. Moreover, due to the ever increasing complexity of newer ICs, low skew clock distribution becomes more and more difficult to achieve. Normally, when an IC is designed, clock domains are chosen with a size that can achieve the desired clock skew, and synchronization logic is added on the signals that cross the clock domains. This synchronization logic adds additional latency on the signals that cross the clock domain partitions.

This clock domain partitioning is typically done before fabricating the chip, since choosing a large clock domain could result in clock skew problems in the real silicon that is very expensive to fix with another revision of the IC. The difficulty is that the timing models that are used to design the clock tree are usually not accurate enough with respect to the real silicon to design a large clock tree with little clock skew.

DESCRIPTION

In the following description, various embodiments of the invention will be described in detail. However, such details are included to facilitate understanding of the invention and to describe exemplary embodiments for employing the invention. Such details should not be used to limit the invention to the particular embodiments described because other variations and embodiments are possible while staying within the scope of the invention. Furthermore, although numerous details are set forth in order to provide a thorough understanding of the embodiments of the invention, it will be apparent to one skilled in the art that these specific details are not required in order to practice the embodiments of the invention. In other instances details such as, well-known methods, types of data, protocols, procedures, components, electrical structures and circuits, are not described in detail, or are shown in block diagram form, in order not to obscure the invention. Furthermore, embodiments of the invention will be described in particular embodiments but may be implemented in hardware, software, firmware, middleware, or a combination thereof.

Embodiments of the invention relate generally to an integrated circuit that includes clock generation circuitry which generates a master clock signal and at least one other clock signal. The master clock signal and the other clock signal are transmitted through a clock distribution tree to a circuit component. In a default mode, the circuit component receives the master clock signal at a first component block to create a first time domain for the first component block of the circuit component and the circuit component receives the other clock signal at a second component block to create a second time domain for the second component block of the circuit component.

Embodiments of the invention may further include bypass logic which creates a bypass path to allow the second component block to receive the master clock signal such that the first and second components are controlled by a common clock domain in response to the master clock signal. Accordingly, the clock domain of the second component block of the circuit component is the same as the clock domain of the first component block such that signals can be transferred between the clock domains with reduced latency—as opposed to the latency typically caused by the required synchronization logic of the default mode. Moreover, embodiments of the invention relate to processes to design dynamically reconfigurable clock domains (e.g. the default and bypass modes) on an integrated circuit, as previously described.

Figure 1:
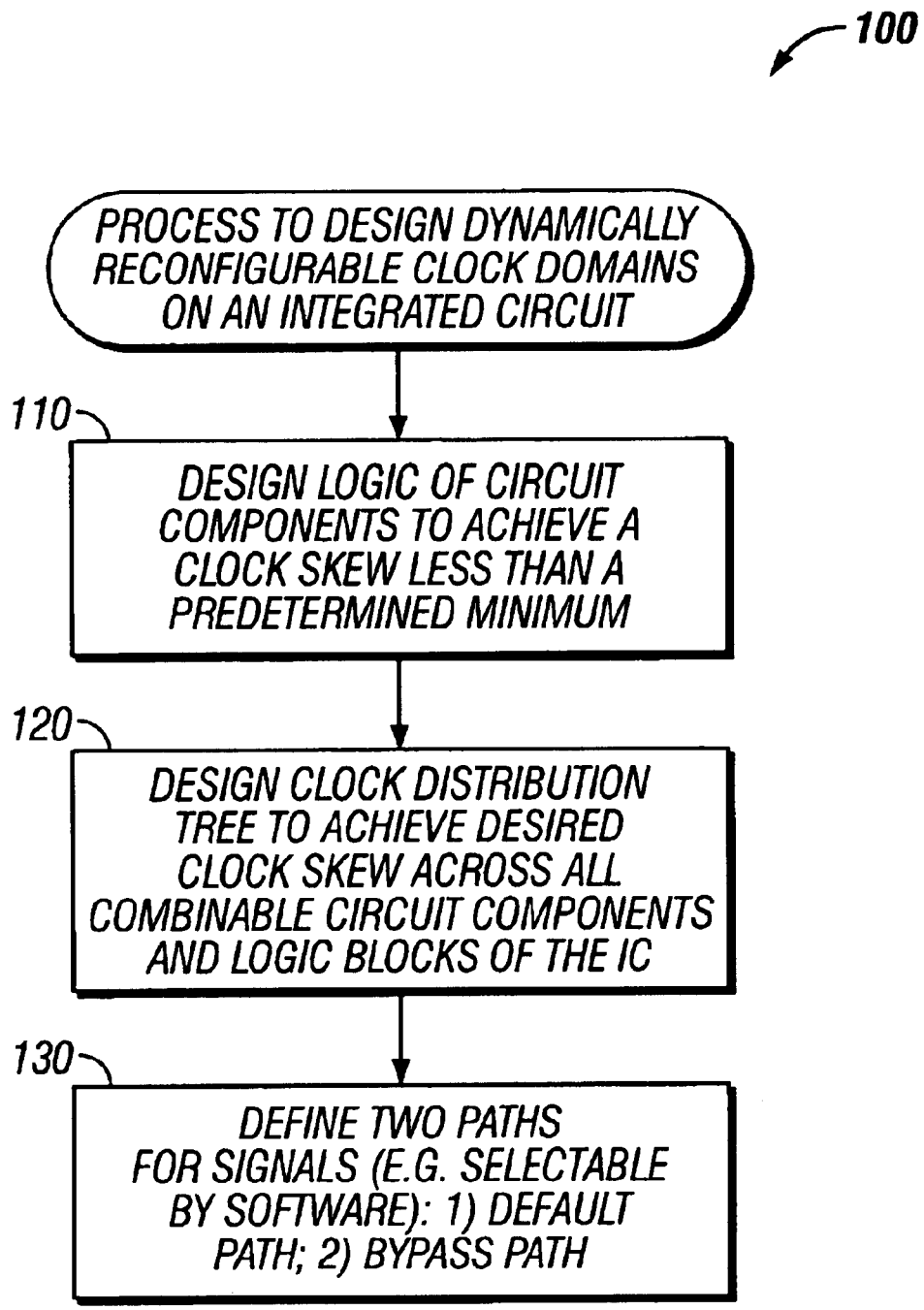
FIG. 1 illustrates a process to design dynamically reconfigurable clock domains on an integrated circuit, according to one embodiment of the invention.

As shown in FIG. 1, FIG. 1 illustrates a process 100 to design dynamically reconfigurable clock domains on an integrated circuit, according to one embodiment of the invention. At block 110 of process 100, the logic of the plurality of circuit components on an integrated circuit are designed in such a way as to achieve a desired clock skew less than a predetermined minimum. The process of designing integrated circuits in view of obtaining desired clock skews is well known in the art. Particularly, as is known in the art, the design of the integrated circuit involves partitioning the chunks of logic of the integrated circuit in such a way so that the sum of the minimum clock to Q delay of the flip-flop and the minimum combinational delay path is greater than the sum of the maximum clock skew for any path and the maximum hold time of the flip-flop in the particular technology. This is to reduce the probability of having hold time problems while reducing the degradation in frequency due to the clock skew. The chunks of combinational logic typically contain many flip-flops (e.g. 10 thousand flip-flops, 20 thousand flip-flops, etc.).

Next, at block 120 of process 100, a clock distribution tree is designed in such a way as to achieve the desired clock skew (previously determined in block 110) across all combinable circuit components, component blocks of the circuit components, and combinational logic blocks of the circuit components for the integrated circuit (as will be discussed). Particularly, as will be discussed in more detail later, the clock distribution tree is designed with the goal of achieving the desired clock skew across all partitions that may possibly be combined together, later, by software configuration. Although, determining clock distribution trees for ICs is well know in the art, embodiments of the invention determine the clock distribution tree for all partitions of the IC that may possibly be combined together later by software configuration.

Further, at block 130 of process 100, two paths for signals that cross clock domain partitions are defined (as will be discussed in detail later with reference to FIGS. 2 and 3), including: 1) a default path; and 2) a bypass path. In one embodiment, these paths can be selected via software. By default, the IC utilizes the default path, which contains synchronization logic that is used when the IC is running in default mode with separate clock domains. The bypass path includes synchronization bypass logic that is used when the chip is reconfigured to combine clock domains. The logic that produces and receives the signals across the clock domains may be designed to work in both handshaking modes for the synchronization logic of the default mode and the synchronization bypass logic of the bypass mode. Also, the setup and hold time analysis preformed to create the clock distribution tree may be done for the bypass mode as well as for the default mode.

As will be discussed, when the IC powers up, all the clock domains are separate by default. In one embodiment, once it is proven that the achieved clock skew between the clock domains in the chip is less than the original goal, software can be used to write a bit to combine the clock domains which results in the bypass mode being selected (e.g. utilizing bypass paths). In the bypass mode, clock domains for a signal are combined into one, such that there is no latency on the signals that cross clock domains. Thus, signals that cross different component blocks of a circuit component of an IC are synchronous with one another thereby reducing latency.

Figure 2:
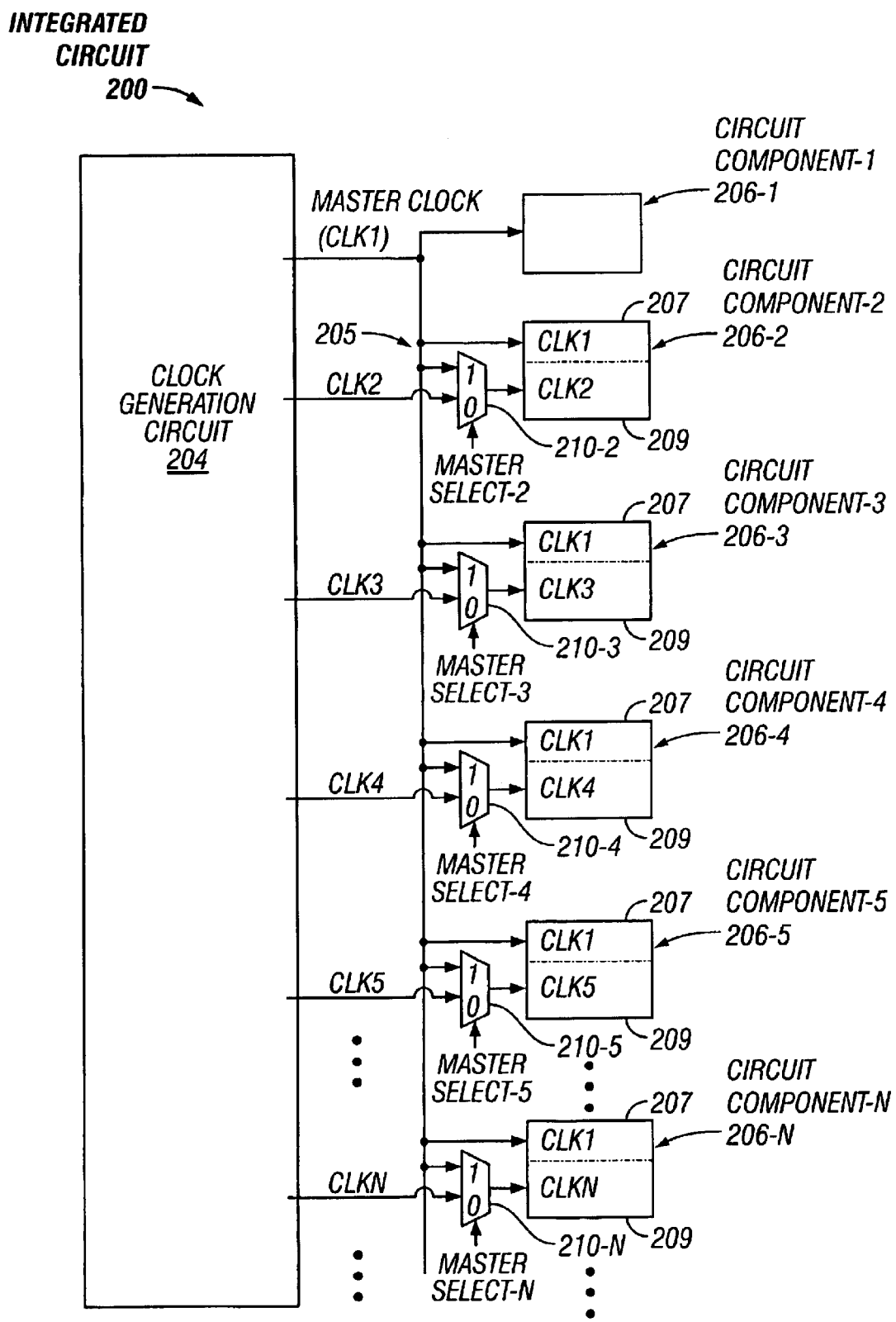
FIG. 2 shows a block diagram of an exemplary integrated circuit having multiple clock signal paths in order to implement dynamically reconfigurable clock domains, according to one embodiment of the invention.

As shown in FIG. 2, FIG. 2 illustrates a block diagram of an exemplary integrated circuit having multiple clock signal paths in order to implement dynamically reconfigurable clock domains, according to one embodiment of the invention. The exemplary integrated circuit 200 that implements dynamically reconfigurable clock domains is designed in accordance with the process 100, previously discussed. As shown in FIG. 2, integrated circuit 200 includes clock generation circuitry 204, a plurality of switches 210 such as multiplexers (e.g. multiplexer 210-2, multiplexer 210-3, etc., through multiplexer 210-N), and circuit components 206 (e.g. circuit component-1 206-1, circuit component-2 206-2, etc., through circuit component-N 206-N). It should be appreciated that as shown in FIG. 2, the integrated circuit 200 is scalable to any number of components N.

The integrated circuit 200 includes clock generation circuitry 204 that generates a plurality of clock signals (CLK1-N) that are coupled to circuit components 206-1 through 206-N, respectively, to generate a clock distribution tree 205 of multiple clock signals paths. Specifically, clock generation circuitry 204 generates a Master clock signal (CLK1) and a plurality of other clock signals (also termed circuit component clock signals): CLK2, CLK3, CLK4, CLK5, and CLKN, as shown in FIG. 2. In this embodiment, the plurality of clock signals (CLK1-N) generated by the clock generation circuitry 204 are each phase and frequency independent of one another. Each circuit component 206-1 through 206-N of the IC 200, respectively, may be any type of circuit component typically found in an integrated circuit that requires a clock signal. For example, each circuit component may be a bus, a processor, a memory, or any type of computer circuit component.

As shown in FIG. 2, in this embodiment, the Master clock signal (CLK1) is directly coupled to circuit component-1 206-1 and is directly coupled to a first component block 207 of each of the circuit components 206-2 through 206-N, respectively. Thus, a first component block 207 of each circuit component 206-2 through 206-N is timed in accordance with the Master clock signal (CLK1).

As shown in FIG. 2, each multiplexer 210-2 through 210-N has two inputs: the Master clock signal (CLK1) and its respective circuit component clock signal (e.g. CLK2 through CLKN). Multiplexers 210-2 through 210-N are by default set to 0 such that a second component block 209 of each respective circuit component 206 is timed by its respective circuit component clock signal (e.g. CLK2 through CLKN). This is termed the default path. However, each multiplexer 210-2 through 210-N is responsive to a respective Master select signal (e.g. Master select signal-2 through Master select signal-N) which, when chosen, selects a bypass mode that instead applies the Master clock (CLK1) to the second component block 209 of the circuit component 206. In this way, a bypass path is created such that signals that traditionally cross time domains in the circuit component (e.g. from the first component block 207 to the second component block 209), resulting in increased latency, can instead operate at the same clock rate (e.g. the clock domains are combined) so that latency is reduced. Thus, signals that cross different component blocks of a circuit component of an IC are instead synchronous with one another thereby reducing latency.

Figure 3:
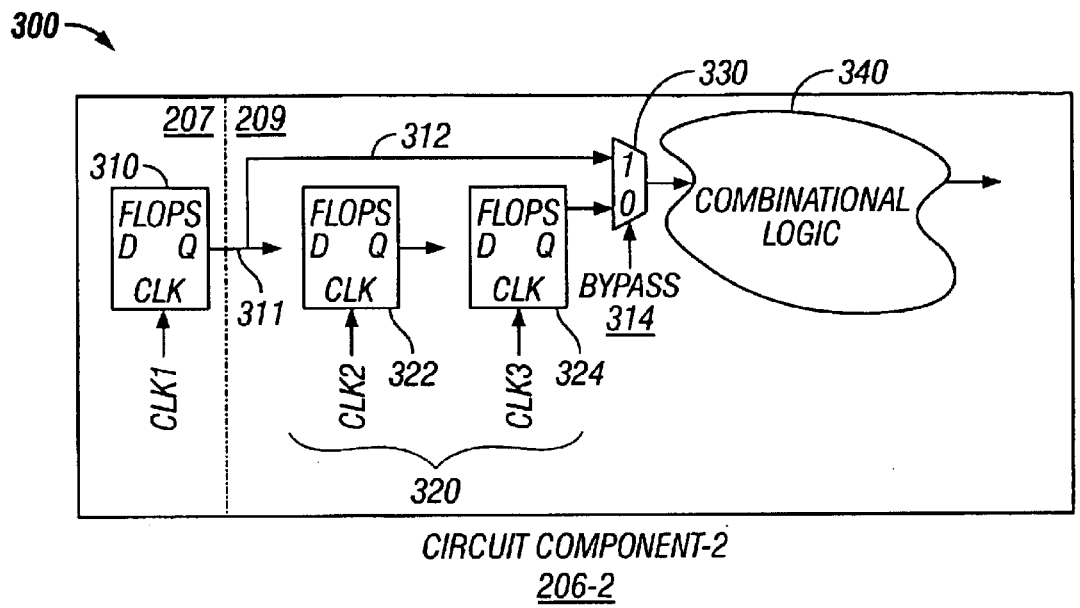
FIG. 3 shows a block diagram illustrating a more detailed view of a circuit component of FIG. 2, utilized in implementing dynamically reconfigurable clock domains, according to one embodiment of the invention.

Turning now to FIG. 3, FIG. 3 shows a block diagram 300 illustrating a more detailed view of circuit component-2 206-2 of FIG. 2, utilized in implementing dynamically reconfigurable clock domains, according to one embodiment of the invention. Particularly, FIG. 3 shows a circuit component that can operate in either default mode (via a default path 311) or in a bypass mode (via a bypass path 312). As should be appreciated, this description is applicable to any of the circuit components 206-2 through 206-N.

As shown in FIG. 3, a signal crossing from a first time domain of the first component block 207 of the circuit component-2 206-2 to the second component block 209 of circuit component-2 having a second time domain, travels along a path that is timed using flip-flop 310, which utilizes Master clock (CLK1). For example, the Master clock (CLK1) signal may correspond to the clock signal of a system bus (e.g. operating at 200 MHz) and the circuit component-2 206-2 may be a specialized core processor (e.g. operating at 218 MHz by default (e.g. CLK2)). The signal crosses into the second component block 209 of circuit component-2 206-2 and crosses clock domains along the default path 311. Synchronization logic is then added on to the signal that cross the clock domains into the second component block 209 of circuit component-2 206-2.

In this example, the synchronization logic includes a double clock synchronizer 320 including a first flip-flop 322 timed at CLK2 and a second flip-flop 324 also timed at CLK2. The signal is clocked by the first and second flip-flops 322 and 324 such that it is translated from the first time domain of the first component block 207 to the second time domain of the second component block 209 and is then passed on to combination logic 340 for processing. Unfortunately, this use of synchronization logic 320 may add additional latency on signals that cross the clock domain partitions.

According to one embodiment of the invention, instead of a signal having to cross time domains, the time domains can instead be combined, and the signal can follow a bypass path 312. In this instance, a signal crosses from a combined time domain from the first component block 207 of the circuit component-2 206-2 to the second component block 209 of circuit component-2 having the same combined time domain. For example, the combined time domains can be set to the Master clock signal (CLK1). Thus, the signal is first timed using flip-flop 310 by Master clock (CLK1). The signal then crosses into and through the second component block 209 of circuit component-2 206-2 utilizing the same combined clock domain (e.g. the same time domain as Master clock (CLK1)) along the bypass path 312.

In order to accomplish this, a bypass switch 330, e.g. a bypass multiplexer, has to be switched on such that the bypass path 312 is activated. Typically, the bypass multiplexer 330 is by default set to 0 such that the default path 311 is used. However, the bypass multiplexer 330 is activated in response to a bypass path activation signal 314 such that the bypass 312 is used instead of the default path 311. The bypass path activation signal 314 is sent when the corresponding master select signal of the corresponding multiplexer 210 is activated indicating that the bypass mode has been chosen for the given circuit component (e.g. in this example circuit component-2 with the master select signal-2). The combination of the master select signal, switch 210, bypass path activation signal 314, and bypass switch 330 can generally be referred to as the bypass logic. Thus, when the bypass path 312 is chosen the Master clock (CLK1) is applied to signals crossing over into the combinational logic 340 of the second component block 209 of the circuit component 206 for processing. In one embodiment, the master select signal and bypass path activation signal can be selected using software, as will be discussed.

Therefore, the synchronization logic (e.g. the double clock synchronizer 320) that is typically added on to the signal when it crosses clock domains is totally avoided and the resultant latency to the signal is also avoided. In this way, a bypass path is created such that signals which traditionally cross time domains, resulting in increased latency, can instead operate at the same clock rate (e.g. the clock domains can be combined) so that latency is reduced. Thus, signals that cross different component blocks of a circuit component of an IC are instead synchronous with one another thereby reducing latency.

It should be appreciated that the integrated circuit (IC) 200, clock distribution tree 205, combinational logic 340, default paths, bypass paths, etc., of FIGS. 2 and 3, only illustrate one example of an IC that can be created utilizing the process 100, previously discussed. ICs with a multitude of different configurations can be created utilizing process 100. Further, it should be appreciated by those skilled in the art that to properly implement the IC 200 the clock distribution tree 205 needs to be designed in such a way as to achieve the desired clock skew across all combinable circuit components 206-1 through 206-N, combinable component blocks (e.g. 207 and 209), and combinational logic blocks 340 of the circuit components of the IC 200. Particularly, the clock distribution tree needs to be designed with the goal of achieving the desired clock skew across all partitions 207, 209 of all the circuit components 206 that may possibly be combined together later by software configuration in accordance with block 120 of process 100. Further, as previously shown in FIGS. 2 and 3, process block 130 of process 100 requires that two paths for signals that cross clock domain partitions are defined including: 1) a default path 311; and 2) a bypass path 312. In one embodiment, these paths can be selected via software.

As previously discussed, by default, the IC 200 utilizes the default path 311, which contains synchronization logic 320 that is used when the IC is running in default mode with separate clock domains. However, as previously discussed, the bypass path 312 includes synchronization bypass logic that is used when the IC 200 is reconfigured to combine clock domains. As previously discussed with reference to process 100, the logic that produces and receives the signals across the clock domains may be designed to work in both handshaking modes for the synchronization logic 320 of the default mode and the synchronization bypass logic of the bypass mode. Also, the setup and hold time analysis performed to create the clock distribution tree 205 may be done for the bypass mode as well as for the default mode.

As will be discussed, when the IC powers up, all the clock domains are separate by default. In one embodiment, once it is proven that the achieved clock skew between the clock domains in the chip is less than the original goal, software can be used to write a bit to combine the clock domains which results in the bypass mode being selected (e.g. utilizing bypass paths). As illustrated previously, in the bypass mode, clock domains for a signal are combined into one, such that there is no latency on signals that cross the clock domains. Thus, signals that cross different component blocks of a circuit component of an IC are synchronous with one another thereby reducing latency.

Figure 4:
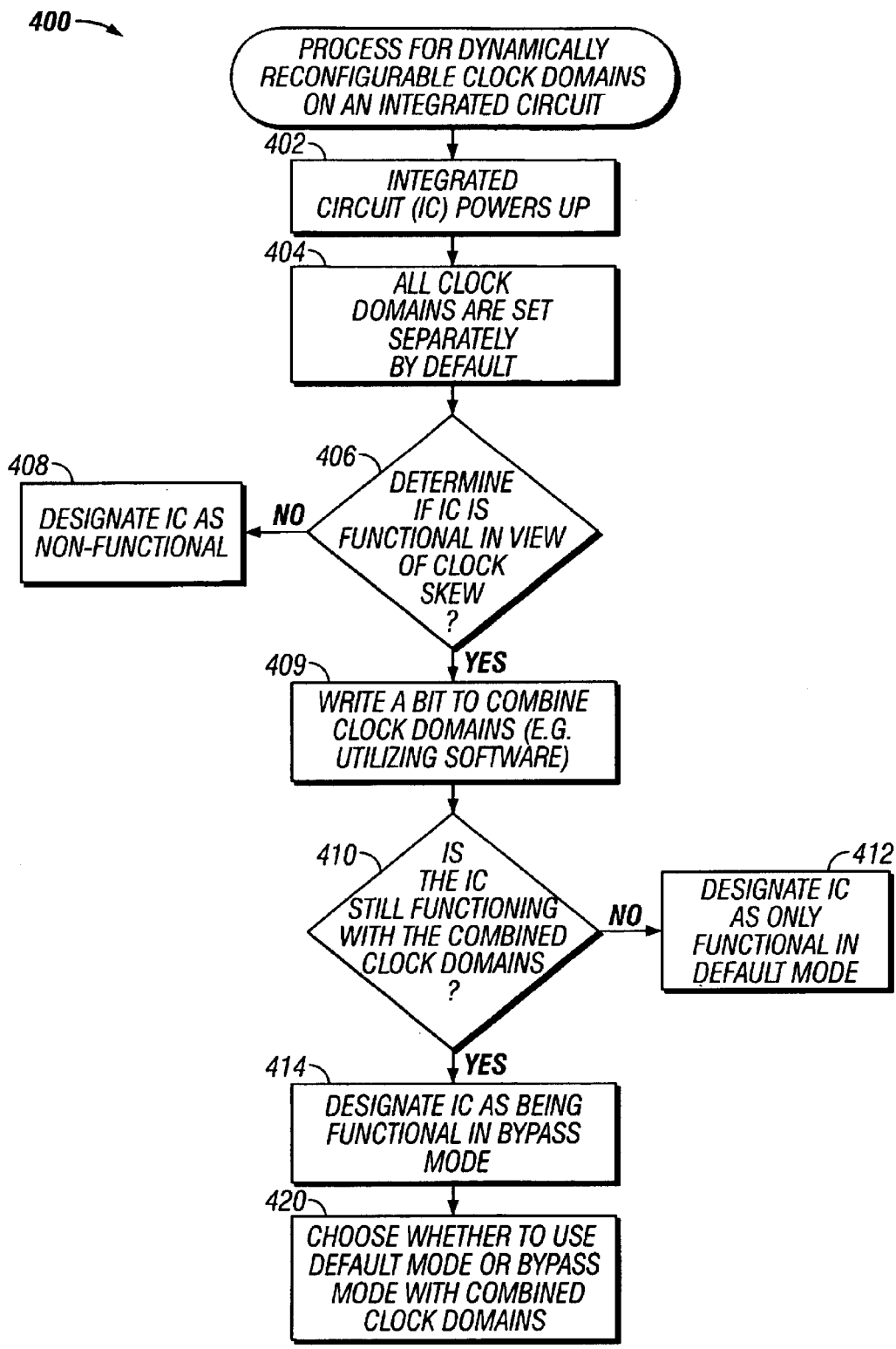
FIG. 4 illustrates a process for providing dynamically reconfigurable clock domains on an integrated circuit, according to one embodiment of the invention.

Turning now to FIG. 4, FIG. 4 illustrates a process 400 for providing dynamically reconfigurable clock domains on an integrated circuit 200, according to one embodiment of the invention. At block 402 of process 400, the integrated circuit is powered up. All of the clock domains for all of the circuit components are set separately by default to run in default mode (e.g to utilize their default paths) (block 404). For example, in the example of the integrated circuit 200 of FIGS. 2 and 3, all of the circuit components 206 are set to run in their default modes using their default paths 311 based on their respective clock domains (e.g. CLKs2-N).

Next, at block 406, it is determined whether the IC is functional in view of clock skew. Typically, this is done by the manufacturer of the IC utilizing test equipment. If the IC is found not to be functional in view of clock skew, due to a given circuit component or all of the circuit components, then the IC is designated as non-functional (block 408). On the other hand, if it is proven that the achieved clock skew between the clock domains in the chip is less than the original goal, and the IC is therefore functional, software can be used to write a bit to combine the clock domains which results in the bypass mode being selected (e.g. utilizing bypass paths) (block 409). Next, the process 400 verifies whether the chip is still functional with combined clock domains (block 410). If the IC is not functional with the combined clock domains, it is designated as only working in default mode (block 412). However, if the IC is still functional with combined clock domains it is then designated as being functional in bypass mode (block 414). A user of the IC (or the manufacturer) can choose whether to use the default mode or the bypass mode with combined clock domains (block 420).

It should be noted that combining clock domains can be done for all of the circuit components (e.g. all of the circuit components are selected) of the IC or, in some embodiments, only to selected circuit components of the IC. This is accomplished by selecting the bypass paths of the selected circuit components (block 410), as previously discussed in detail with reference to FIGS. 2 and 3.

Further, in one embodiment, the selection of bypass modes for all of the clock domains or only specific clock domains can be done by software. The software can be used to set a bit to one in a clocking register for each circuit component selected for bypass mode to designate that the clock domains are to be combined for that circuit component 206 (e.g. the bypass path is chosen such that the selected circuit component 206 is timed with the Master clock CLK1). This results in the Master clock select signal being driven to the appropriate multiplexer 210 for the selected circuit component 206 and the bypass signal 314 being driven to the appropriate bypass multiplexer 330 in the selected circuit component 206. In this way, the different component blocks of the circuit component operate synchronously with the Master clock signal. Particularly, a signal clocked at a first rate does not have to go through synchronization logic 320 to be converted from one time domain to another time domain. Thus, signals that cross different component blocks of a circuit component of an IC are instead synchronous with one another thereby reducing latency.

Further, after testing proves that the IC is functional in view of the clock skew and is functional in default modes and bypass modes, a user of the IC (or the manufacturer) can choose whether to use the default mode or the bypass mode with combined clock domains (block 420). Typically, the IC is automatically set to operate in default mode (i.e. utilizing default paths). However, a user (or the manufacturer) can select that all of the circuit components of the IC or certain components of the IC operate with combined clock domains (e.g. utilizing bypass paths) by using software to select combined clock domains, as previously discussed. For example, even if the IC is functional in default mode, the user may wish to program the chip using software to combine the clock domains of all of the circuit components of the IC or only certain circuit components of the IC such that they run with less latency on the signals that communicate between the clock domains, thus resulting in higher performance. However, after circuit components of the IC are set to operate in bypass mode, they cannot be changed back to operate in default mode again, unless the whole IC is reset (e.g. a phase locked loop (PLL) reset is performed).

Figure 5:
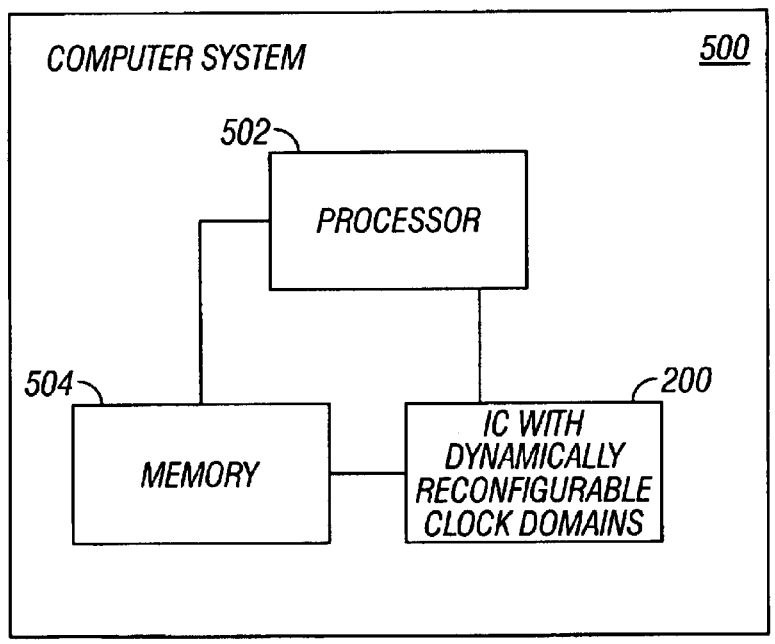
FIG. 5 shows a block diagram of a very basic computer system configuration that provides an exemplary environment in which an integrated circuit having dynamically reconfigurable clock domains, according to one embodiment of the invention, can be practiced.

Referring briefly to FIG. 5, FIG. 5 shows a block diagram of a very basic computer system configuration 500 that provides an exemplary environment in which an integrated circuit 200 having dynamically reconfigurable clock domains, according to one embodiment of the invention, can be practiced. A user can utilize the integrated circuit 200 with a vast multitude of different computer systems 500. A basic computer system configuration having a processor 502 and a memory 504 is shown. Particularly, the memory 504 may store software to write bits into a clocking register such that the system 500 under the control of processor 502 may utilize the software to provide the user (or the manufacturer) with the function of choosing to combine clock domains for all of the circuit components of the IC 200 or only selected circuit components of the IC 200, as previously discussed. Thus, using the system configuration 500 a user can utilize the IC 200 having dynamically reconfigurable clock domains. As previously discussed, when clock domains are combined for a circuit component, signals that cross different component blocks of the circuit component of the IC are synchronous with one another thereby reducing latency.

For the purposes of the present specification, the term "processor" or "CPU" refers to any machine that is capable of executing a sequence of instructions and shall be taken to include, but not be limited to, general purpose microprocessors, special purpose microprocessors, application specific integrated circuits (ASIC), multi-media controllers, signal processors and microcontrollers, etc. The memory 504 can include any memory device adapted to store digital information, such as static random access memory (SRAM), dynamic random access memory (DRAM), synchronous dynamic random access memory (SDRAM), and double data rate (DDR) SDRAM or DRAM, etc. Thus, in one embodiment, memory 504 include volatile memory. Further, memory 504 can also include non-volatile memory such as read-only memory (ROM). It should be appreciated that the exemplary illustration of the computer system configuration 500 is only an exemplary illustration of an environment in which embodiments of the invention can be practiced.

According to embodiments of the invention, a user or the manufacturer may decide whether or not to combine clock domains. For example, if a user chooses not to combine clock domains, then the IC 200 continues to operate using the default time domain. However, if a user chooses to combine clock domains (e.g. for all of the circuit components of the IC or only certain circuit components of the IC), then software stored in memory 504 under the control of processor 502 may be utilized to write a bit in a clocking register for the selected circuit component in order to combine the respective clock domains for the circuit component, as previously discussed. This can be done for all of the circuit components or selected circuit components to select the bypass paths of the circuit components such that the clock domains for different component blocks of circuit components are combined, as previously discussed in detail with reference to FIGS. 2 and 3.

While embodiments of the present invention and its various functional components have been described in particular embodiments, it should be appreciated the embodiments of the present invention can be implemented in hardware, software, firmware, middleware or a combination thereof and utilized in systems, subsystems, components, or sub-components thereof. When implemented in software or firmware, the elements of the present invention are the instructions/code segments to perform the necessary tasks. The program or code segments can be stored in a machine readable medium (e.g. a processor readable medium or a computer program product), or transmitted by a computer data signal embodied in a carrier wave, or a signal modulated by a carrier, over a transmission medium or communication link. The machine-readable medium may include any medium that can store or transfer information in a form readable and executable by a machine (e.g. a processor, a computer, etc.). Examples of the machine-readable medium include an electronic circuit, a semiconductor memory device, a ROM, a flash memory, an erasable programmable ROM (EPROM), a floppy diskette, a compact disk CD-ROM, an optical disk, a hard disk, a fiber optic medium, a radio frequency (RF) link, etc. The computer data signal may include any signal that can propagate over a transmission medium such as electronic network channels, optical fibers, air, electromagnetic, RF links, etc. The code segments may be downloaded via networks such as the Internet, Intranet, etc.

While embodiments of the invention have been described with reference to illustrative embodiments, these descriptions are not intended to be construed in a limiting sense. Various modifications of the illustrative embodiments, as well as other embodiments of the invention, which are apparent to persons skilled in the art to which embodiments of the invention pertain, are deemed to lie within the spirit and scope of the invention.

What is claimed is:

1. An integrated circuit comprising:
   clock generation circuitry to generate a master clock signal and at least one other clock signal transmitted through a clock distribution tree to a circuit component, the circuit component receiving the master clock signal at a first component block of the circuit component;
   bypass logic to define a bypass path to allow a second component block of the circuit component to receive the master clock signal, wherein during functionality testing of the integrated circuit the bypass path of the bypass logic is selectable such that the first and second component blocks of the circuit component are controlled by a common clock domain in response to the master clock signal so that signals can be passed between the first and second component blocks; and
   a default path to allow the second component block of the circuit component to receive the other clock signal such that the clock domain of the second component block of the circuit component is different from the clock domain of the first component block of the circuit component, wherein one of the default path or the bypass path is automatically selected when the integrated circuit powers up.

2. The integrated circuit of claim 1, wherein the bypass logic includes a switch that allows for the coupling of either the master clock signal or the other clock signal to the second component block of the circuit component.

3. The integrated circuit of claim 2, wherein the switch is responsive to a master select signal to select the master clock signal for coupling to the second component block of the circuit component.

4. The integrated circuit of claim 1, wherein the bypass logic includes a bypass switch located in the second component block of the circuit component.

5. The integrated circuit of claim 4, wherein the bypass switch is responsive to a bypass activation signal to activate the bypass path.

6. The integrated circuit of claim 1, wherein the bypass path is selected by a user.

7. The integrated circuit of claim 6, wherein selecting the bypass path further includes utilizing software to write a bit to a clocking register to instruct the circuit component to use the bypass path.

8. A system comprising:
   a processor coupled to memory; and
   an integrated circuit coupled to the processor, the integrated circuit including:
       clock generation circuitry to generate a master clock signal and at least one other clock signal transmitted through a clock distribution tree to a circuit component, the circuit component receiving the master clock signal at a first component block of the circuit component;
       bypass logic to define a bypass path to allow a second component block of the circuit component to receive the master clock signal, wherein during functionality testing of the integrated circuit the bypass path of the bypass logic is selectable such that the first and second component blocks of the circuit component are controlled by a common clock domain in response to the master clock signal so that signals can be passed between the first and second component blocks; and
       and a default path to allow the second component block of the circuit component to receive the other clock signal such that the clock domain of the second component block of the circuit component is different from the clock domain of the first component block of the circuit component, wherein one of the default path or the bypass path is automatically selected when the integrated circuit powers up.

9. The system of claim 8, wherein the bypass logic includes a switch that allows for the coupling of either the master clock signal or the other clock signal to the second component block of the circuit component.

10. The system of claim 9, wherein the switch is responsive to a master select signal to select the master clock signal for coupling to the second component block of the circuit component.

11. The system of claim 8, wherein the bypass logic includes a bypass switch located in the second component block of the circuit component.

12. The system of claim 11, wherein the bypass switch is responsive to a bypass activation signal to activate the bypass path.

13. The system of claim 8 wherein the bypass path is selected by a user.

14. The system of claim 13, wherein selecting the bypass path further includes, the processor utilizing software stored in memory to write a bit to a clocking register to instruct the circuit component to use the bypass path.

* * * * *

UNITED STATES PATENT AND TRADEMARK OFFICE
CERTIFICATE OF CORRECTION

PATENT NO. : 6,738,963 B2
DATED : May 18, 2004
INVENTOR(S) : Chaudhari

Page 1 of 1

It is certified that error appears in the above-identified patent and that said Letters Patent is hereby corrected as shown below:

<u>Column 4,</u>
Line 8, delete "preformed" and insert -- performed --.

Signed and Sealed this

Twenty-seventh Day of July, 2004

JON W. DUDAS
*Acting Director of the United States Patent and Trademark Office*